United States Patent [19]

Mizutani

[11] Patent Number: 4,698,659
[45] Date of Patent: Oct. 6, 1987

[54] STACKED COMPLEMENTARY METAL OXIDE SEMICONDUCTOR INVERTER

[75] Inventor: Yoshihisa Mizutani, Tokyo, Japan

[73] Assignee: Tokyo Shibaura Denki Kabushiki Kaisha, Kawasaki, Japan

[21] Appl. No.: 865,652

[22] Filed: May 16, 1986

Related U.S. Application Data

[63] Continuation of Ser. No. 485,413, Apr. 15, 1983, abandoned.

[30] Foreign Application Priority Data

May 31, 1982 [JP] Japan .................................. 57-92923

[51] Int. Cl.⁴ ..................... H01L 29/78; H01L 27/02; H01L 29/04; H01L 23/48
[52] U.S. Cl. .................................. 357/42; 357/23.1; 357/23.7; 357/59; 357/67; 357/71
[58] Field of Search .................. 357/23.1, 42, 59, 67, 357/71, 23.7, 4

[56] References Cited

U.S. PATENT DOCUMENTS

| | | | |
|---|---|---|---|
| 4,329,706 | 5/1982 | Crowder et al. | 357/71 |
| 4,333,099 | 6/1982 | Tanguay et al. | 357/67 |
| 4,343,082 | 8/1982 | Lepselter et al. | 357/67 S |
| 4,374,700 | 2/1983 | Scott et al. | 357/67 S |

FOREIGN PATENT DOCUMENTS

| | | | |
|---|---|---|---|
| 57-43455 | 3/1982 | Japan | 357/42 |
| 57-204171 | 12/1982 | Japan | 357/42 |
| 2075259 | 11/1981 | United Kingdom . | |
| 2083282 | 3/1982 | United Kingdom | 357/71 S |

OTHER PUBLICATIONS

Colinge et al., "A High Density CMOS Inverter With Stacked Transistors," IEEE Electron Device Letters, vol. EDL-2, No. 10, Oct. 1981; New York, pp. 250-251 (FIG. 1).

J. F. Gibbons et al., "One-Gate-Wide CMOS Inverter on Laser-Recrystallized Polysilicon" *IEEE Electron Device Letters,* vol. EDL-1, (1980) pp. 117-118.

Colinge et al., "Stacked Transistors CMOS (ST-MOS), an NMOS Technology Modified to CMOS," *IEEE Journal of Solid-State Circuits,* vol. SC-17, No. 2, Apr. 1982.

*Primary Examiner*—J. Carroll
*Attorney, Agent, or Firm*—Finnegan, Henderson, Farabow, Garrett & Dunner

[57] ABSTRACT

An MOS transistor of second conductivity type is provided which is formed in a semiconductor substrate of first conductivity type and includes a first source region of second conductivity type, a first drain region of second conductivity type, and a gate electrode provided on a gate insulation layer. Further, an MOS transistor of first conductivity type is provided which is stacked on the MOS transistor of second conductivity type and includes a second source region, a second drain region and the gate electrode. The first and second source regions are connected to each other through a conductive layer which is selected from a given metal layer and a given metal silicide layer.

4 Claims, 16 Drawing Figures

FIG. 1
(PRIOR ART)
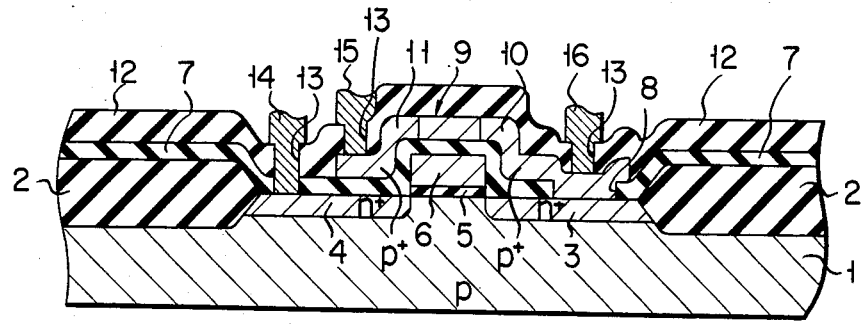
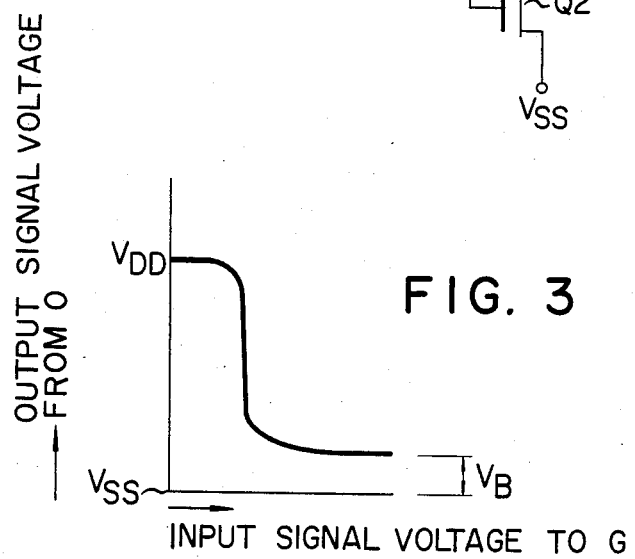
FIG. 2
FIG. 3

STACKED COMPLEMENTARY METAL OXIDE SEMICONDUCTOR INVERTER

This application is a continuation of application Ser. No. 485,413, filed Apr. 15, 1983, abandoned.

BACKGROUND OF THE INVENTION

The present invention relates to a stacked complementary metal oxide semiconductor inverter (referred to as a stacked CMOS inverter).

A stacked CMOS inverter with a cross section shown in FIG. 1 has been known. In FIG. 1, a field oxide layer 2 for electrically isolating semiconductor elements one from another is provided on one of the surface regions of a P type silicon substrate 1. An n+ type source region 3 and an n+ type drain region 4, which are electrically isolated from each other, are provided in the land substrate region isolated by the field oxide layer 2. A gate oxide layer 5 is provided on the surface of the substrate region located between the source and drain regions. A gate electrode 6 is laid over the gate oxide layer 5. The surfaces of the gate electrode 6, the source region 3 and the drain region 4 are covered with a CVD-SiO$_2$ layer 7. The SiO$_2$ layer 7 on the surface of the gate electrode 6 serves as a gate oxide layer of a p-channel MOS transistor to be described later. A through-hole 8 is formed in a part of a region of the CVD-SiO$_2$ layer 7, which faces the source region 3. A polycrystalline silicon layer 9 is provided laying over the gate electrode 6, at least a portion of the source region 3, and the drain region 4. A portion of the polycrystalline silicon layer 9, which is located facing the gate electrode 6, is formed as an electrical isolating layer. A portion of the same, which faces the source region 3, is used as a p$^{30}$ source region 10. A portion of the same confronts a p$^{30}$ drain region 11. The p$^{30}$ source region 10 is in contact with the n+ source region 3 through the through-hole 8 of the CVD-SiO$_2$ layer 7. The entire surface of the semiconductor device of FIG. 1 containing the polycrystalline silicon layer 9 is covered with an interlayer insulation layer 12 made of CVD-SiO$_2$ layer. An aluminium interconnection electrode 14 (power source electrode), which comes in contact with the n+ drain region 4 through a contact hole 13 passing through the interlayer 12 and the CVD-SiO$_2$ layer 7, is formed on the insulation layer 12. Also formed on the insulation layer 12 is another aluminium interconnection electrode 15 (the other power source electrode) connected to the p$^{30}$ drain region 11 through the contact hole 13 passing through the insulation layer 12. Another aluminium connection electrode 16 (signal output electrode) is further formed on the insulation layer 12 and is connected to the p$^{30}$ source region 10 through a contact hole 13 passing through the insulation layer 12. The CMOS inverter thus structured contains an n-channel MOS transistor formed in the semiconductor substrate 1, a p-channel MOS transistor formed by the polycrystalline silicon layer 9 layered through an insulation layer over the n-channel MOS transistor, the gate electrode 6 being commonly used for the n-channel MOS transistor and the p-channel MOS transistor.

An equivalent circuit of the CMOS inverter shown in FIG. 1 is illustrated in FIG. 2. In the circuit, Q1 corresponds to the p-channel MOS transistor, Q2 the n-channel MOS transistor, and G the gate electrode 6, O a signal output electrode 16, V$_{DD}$ a power source electrode 15, and V$_{SS}$ a power source electrode 14. Normally, the power source electrode V$_{SS}$ is set at an earth potential and the power source electrode V$_{DD}$ at 1 to 5 V, for driving the inverter.

In the inverter shown in FIG. 1, the signal output electrode 16 normally contacts the p$^{30}$ source region 10 of the polycrystalline silicon layer 9 forming the p-channel MOS transistor. The source region 3 of the n-channel MOS transistor directly contacts the source region 10 of the p-channel MOS transistor through the through-hole 8. Therefore, a p-n junction is formed between the source regions 3 and 10. Accordingly, as shown in FIG. 2, a parasitic diode D1 with a polarity as shown is formed between the source region 3 of the n-channel MOS transistor Q2 and the signal output terminal O. When the parasitic diode D1 is present, the output signal voltage from the output signal terminal O exhibits a response characteristic against an input signal voltage supplied to the gate terminal G, as shown in FIG. 3. To be more specific, with an increase of the amplitude of the input signal voltage applied to the gate terminal G, when the p-channel MOS transistor Q1 is in an OFF state and the n-channel MOS transistor Q2 is in an ON state, the output voltage from the signal output terminal O cannot have the level of V$_{SS}$, but has a level of V$_B$ which is a potential difference at the p-n junction of the parasitic diode D1. In other words, the amplitude of the output signal voltage becomes smaller by V$_B$ than when the parasitic diode D1 is not present. This implies that it is very difficult to distinctively recognize the level state of the output signal voltage, that is, whether the level of the output signal voltage is "0" or "1". Normally, the potential difference at the p-n junction is approximately 0.7 V. Accordingly, when the power source voltage V$_{DD}$ is low, it is very difficult to distinguish the different level states of the output signal voltage.

The CMOS inverter, in which a p-channel MOS transistor is formed in the silicon substrate 1 and an n-channel MOS transistor is formed by the polycrystalline silicon layer 9, is also attendent with the parasitic diode. In this case, as shown in the equivalent circuit of FIG. 4, the p-channel MOS transistor is denoted as Q1' and the n-channel MOS transistor as Q2'. The parasitic diode D2 is inserted between the signal voltage output terminal O and the source of the transistor Q1'. A graph in FIG. 5 represents a response characteristic of an output signal voltage against an input signal voltage level to the gate G. In this case, the power source voltage V$_{DD}$ is reduced by a potential difference V$_B$ at the p-n junction of the parasitic diode D2, and is derived from the output signal terminal O.

SUMMARY OF THE INVENTION

Accordingly, an object of the present invention is to provide a stacked CMOS inverter with a structure which rejects the formation of a parasitic diode between the source region and the signal output terminal of the n-channel MOS transistor.

According to the present invention, there is provided a stacked CMOS inverter comprising: a semiconductor substrate of first conductivity type; an MOS transistor of second conductivity type including a first source region and a first drain region, which are of second conductivity type, provided in one of the surface regions of the semiconductor substrate and electrically isolated from each other, and a gate electrode provided on the semiconductor substrate between the first source region and the first drain region through a first insulation layer; a second insulation layer for covering the surfaces of the gate electrode, the first source region and the first drain region; an MOS transistor of first conductivity type including a semiconductor layer formed on the second insulation layer which has a portion facing the gate electrode and serving as an electrical isolation layer, a portion facing the first source region and serving as a second source region of first conductivity type, and a portion facing the first drain region and serving as a second drain region of first conductivity type, and the gate electrode, the second insulation layer interposed between the gate electrode and the electrical isolation layer being used as a gate insulation layer; means for electrically connecting the first and second source regions; and connection electrodes for connecting a common connection point of the first and second source regions and the first and second drain regions to an exterior circuit; the electrically connecting means includes means for connecting the first and second source regions through a first conductive layer which is selected from a given metal layer and a given metal silicide layer.

According to this invention, with the provision of the first conductive layer interlayered between the first and second source regions, the formation of a parasitic diode between the first and second source regions is eliminated. This feature allows the inverter to have an output signal with a large amplitude. The level state of the output signal can be distinctively recognized. Further, if a given metal layer or a given metal silicide layer is formed on both upper surfaces of the first source region and the first drain region, the sheet resistances of the first source region and the first drain region are reduced. These useful features cooperate to provide a stacked CMOS inverter operable at high speed.

BRIEF DESCRIPTION OF THE DRAWINGS

FIG. 1 shows a cross-sectional view of a conventional stacked CMOS inverter;

FIG. 2 shows an equivalent circuit of the stacked CMOS inverter of FIG. 1;

FIG. 3 shows a relationship between an input signal voltage and an output signal voltage of the equivalent circuit of FIG. 2;

DETAILED DESCRIPTION OF THE PREFERRED EMBODIMENTS

Figure 4:
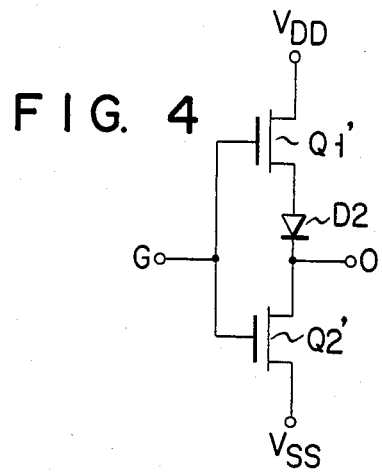
FIG. 4 shows an equivalent circuit of a stacked CMOS inverter whose structure is not illustrated.
Figure 5:
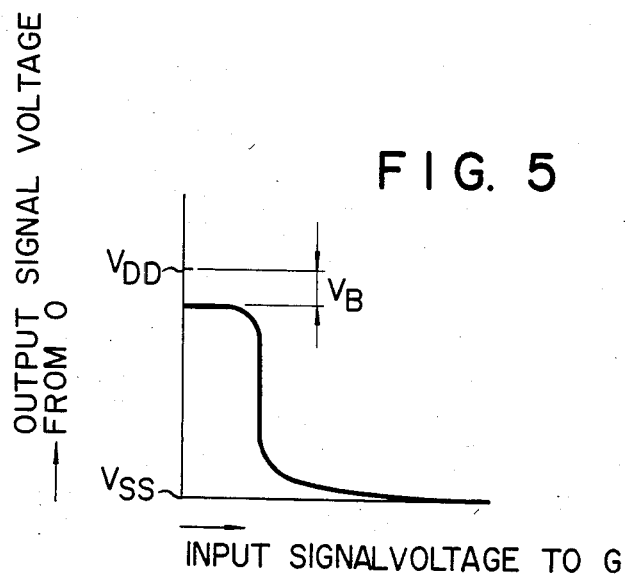
FIG. 5 shows a relationship between an input signal voltage and an output signal voltage of the equivalent circuit of FIG. 4.
Figure 6A:
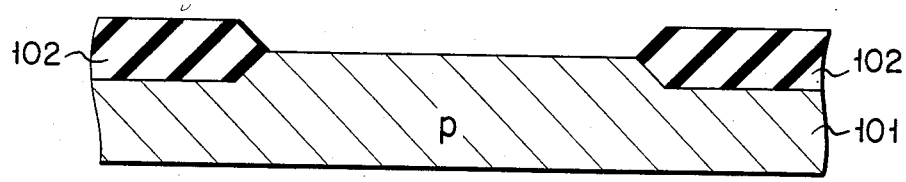
FIGS. 6A to 6J are cross-sectional views illustrating a sequence of process steps for manufacturing a stacked CMOS inverter according to an embodiment of the invention.
Figure 6B:
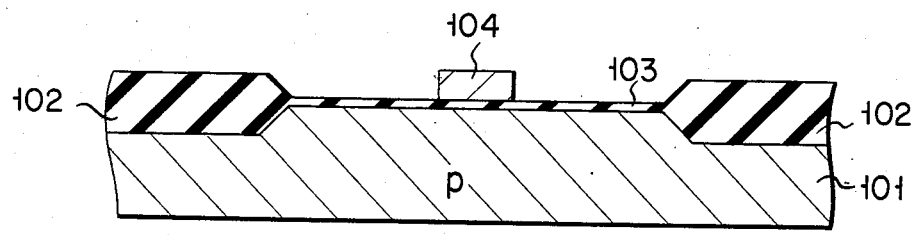
Figure 6C:
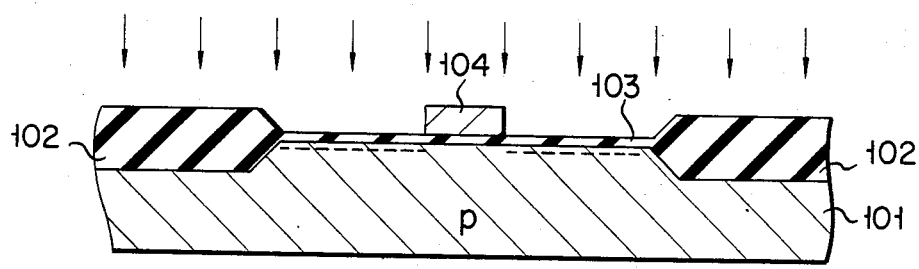
Figure 6D:
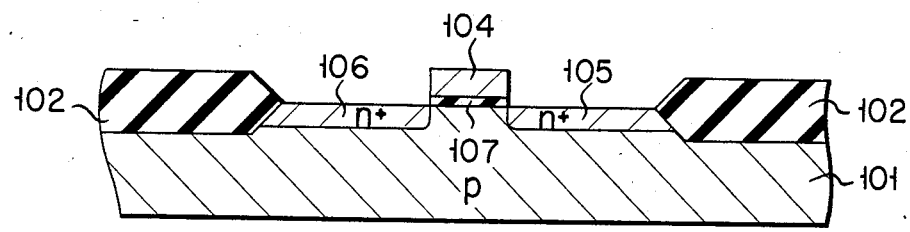
Figure 6E:
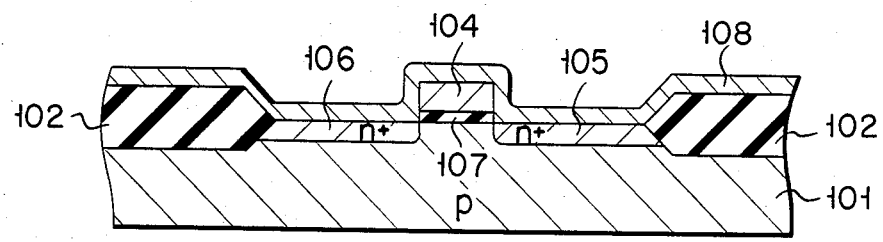
Figure 6F:
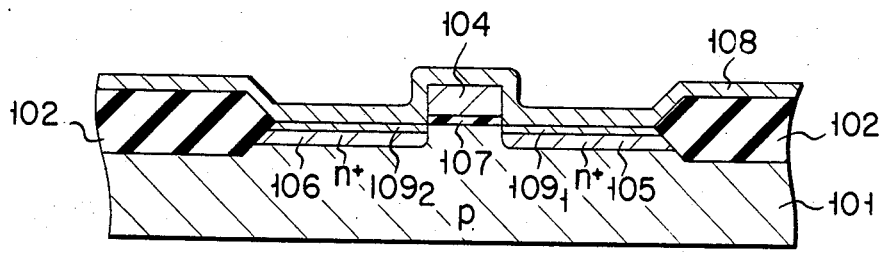
Figure 6G:
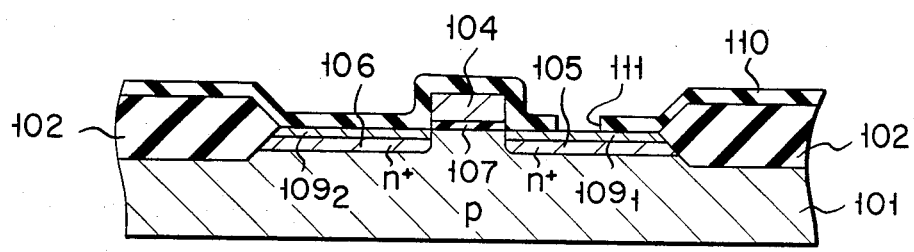
Figure 6H:
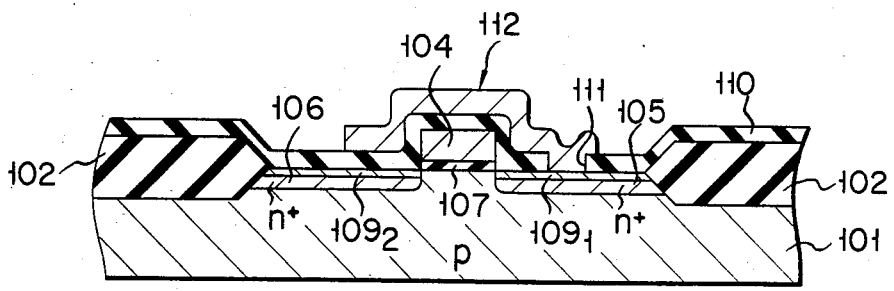
Figure 6I:
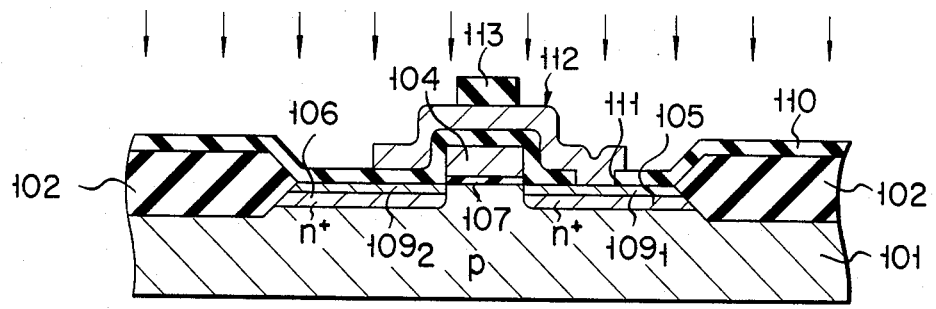
Figure 6J:
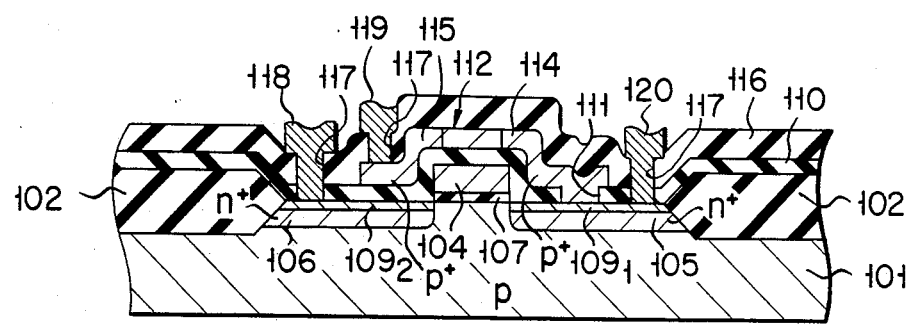

FIG. 6J shows a cross-sectional view of a stacked type CMOS inverter which is an embodiment of the present invention. FIGS. 6A to 6I show a series of cross-sectional views illustrating sequential steps for fabricating the inverter shown in FIG. 6J.

(i) A P-type silicon substrate 101 is selectively oxidized to form a field oxide layer 102 for electrically isolating regions in which semiconductor elements are to be formed (FIG. 6A). Then, it is subjected to a thermal oxidation process in an oxygen atmoshphere at 1,000° C. An oxide layer 103 with a 250Å thickness, for example, is grown on an island-shaped semiconductor substrate region (semiconductor element forming region), which is isolated from other semiconductor element forming regions by the field oxide layer 102. A platinum silicide (PtSi) layer, for example, is deposited over the entire surface of the semiproduct of the semiconductor device. The PtSi layer deposited is patterned by a photoetching process for selectively forming a gate electrode 104 as a PtSi layer on the oxide layer 103 (FIG. 6B).

(ii) Ions of arsenic (As), for example, are implanted into the substrate 101, using a mask of the gate electrode 104 and the field oxide layer 102 (FIG. 6C), where the acceleration voltage is 50 KeV and a dosage of ions is $1 \times 10^{15}/cm^2$. Then, the semiproduct thus processed is subjected to a heat treatment, to thereby activate the arsenic ion implanted layer and to form an n+ type source region 105 and an n+ type drain region 106. Further, using the gate electrode 104 as a mask, the oxide layer 103 is selectively etched to form a gate oxide layer 107 (FIG. 6D).

(iii) A platinum layer (Pt layer) 108 is deposited over the entire surface of the semiproduct by the sputtering process (FIG. 6E). Then, it is thermally treated for 30 minutes in an $N_2$ atmosphere at 700° C. As a result of the heat treatment, the Pt in contact with the surfaces of the n+ source region 105 and the n+ drain region 106, reacts with silicon to form PtSi layers $109_1$ and $109_2$ (FIG. 6F).

(iv) A Pt layer not reacting with the Si is removed by aqua regia. Further, a CVD-$SiO_2$ thin layer 110 with a 250Å thickness, for example, serving as a gate insultion layer of a P-channel MOS transistor is deposited on the entire surface of the semiproduct. The thin layer 110 is selectively etched by the photoetching technique, thereby forming a through hole 111 at a portion of the CVD-$SiO_2$ thin layer 110, which faces the n+ source region (FIG. 6G). Then, a polycrystalline silicon layer with a 3,000Å thickness, for example, is deposited over the entire surface of the semiproduct by the CVD process. The silicon layer is patterned by the photoetching process. Following this, a polycrystalline silicon layer pattern 112 is formed on the CVD-$SiO_2$ thin layer 110 at the position including the through-hole 111 and the gate electrode 104 (FIG. 6H).

(v) In the next step, a resist pattern 113 is formed on the silicon layer pattern 112 at the position facing the gate electrode 104. With a mask of the resist pattern 113, p type impurities, for example, boron ions, are implanted into the polycrystalline silicon layer pattern 112 with an acceleration voltage of 40 KeV and a dosage of $1 \times 10^{15}/cm^2$ (FIG. 6I). Before the execution of step 6I, an n-type impurity such as arsenic is ion-implanted into the portion of the polycrystalline silicon layer pattern 112 which is to serve as a channel region, thereby controlling a threshold voltage.

Alternatively, the polycrystalline silicon layer pattern 112 is irradiated with an energy beam such as a laser beam to monocrystallize the silicon layer pattern 112 or to improve the crystallization.

(vi) In the following step, the resist pattern is removed. The semiproduct is then subjected to a heat treatment to activate the boron ion-implanted layer in the polycrystalline silicon layer pattern 112. Thus, a $p^{30}$ type source region 114 and a $p^{30}$ type drain region 115 are formed. The $p^{30}$ type source region 114 of the polycrystalline silicon layer pattern 112 electrically contacts the n+ type source region 105 provided in the substrate 101 through the through-hole 111 provided through the CVD-SiO$_2$ layer 110 and the PtSi layer 109$_1$. Subsequently, a CVD-SiO$_2$ layer 116 with a thickness of 8,000Å is deposited on the entire surface, and then contact holes 117 are formed in the layer 116. Then, an aluminium layer is deposited on the entire surface of the layer 116. The aluminium layer is patterned to form an Al interconnection electrode (one power source electrode) 118 connected to the PtSi layer 109$_2$ on the n+ drain region 106 through a contact hole 117, an Al interconnection electrode (the other power source electrode) 119 connected to the p$^{30}$ type drain region 115 through a contact hole 117, and an interconnection electrode (signal output electrode) 120 connected through the contact hole 117 to the PtSi layer 109$_1$ on the n+ type source region 105 (FIG. 6J).

In the stacked CMOS inverter shown in FIG. 6J, the source region 105 of the n-channel MOS transistor formed in the p-type silicon substrate 101 and the p$^{30}$ type source region 114 of the p-channel MOS transistor formed by the polycrystalline silicon layer pattern 112, come in contact with each other through the PtSi layer 109$_1$. Therefore, the parasitic diode D1 shown in FIG. 2 is not formed. Accordingly, when a signal voltage is applied to the common gate electrode 104 to operate the CMOS inverter, the signal output from the signal output electrode 120 is swung so as to completely cover the power source voltages $V_{DD}$ and $V_{SS}$. Therefore, the level discrimination of the signal output voltage can be remarkably improved. Further, a diffusing rate of impurities in the PtSi layer 109$_1$ intervening between the source region 105 of the n-channel MOS transistor and the source region 114 of the p-channel MOS transistor is very small. Therefore, it is possible for boron contained in the p$^{30}$ type source region 114 to diffuse into the n+ type source region 105. This low rate of boron diffusion further prevents boron in the p$^{30}$ type source region 114 from passing through the n+ type source region 105 to diffuse into the silicon substrate 101 and to short both the p$^{30}$ type source region 114 and the silicon substrate 101. The above effects are especially pronounced when the element-forming regions on the substrate 101 are made smaller, and thus the n+ type source and drain regions are made shallower. Further, when the source and drain regions 105 and 106 are shallowly formed, the increase in the sheet resistance of these regions can be kept low with the metal layers 109$_1$ and 109$_2$. As a result, the inverter can be operated at high speed.

The same effects can be attained in the case of a stacked CMOS inverter in which a p-channel MOS transistor is formed in the substrate and an n-channel MOS transistor is formed by a polycrystalline silicon layer pattern 112. The gate electrode 104 is not limited to PtSi, but may be formed of a metal such as Mo, W or Pd, or a silicide of these metals or polycrystalline silicon.

Figure 7:
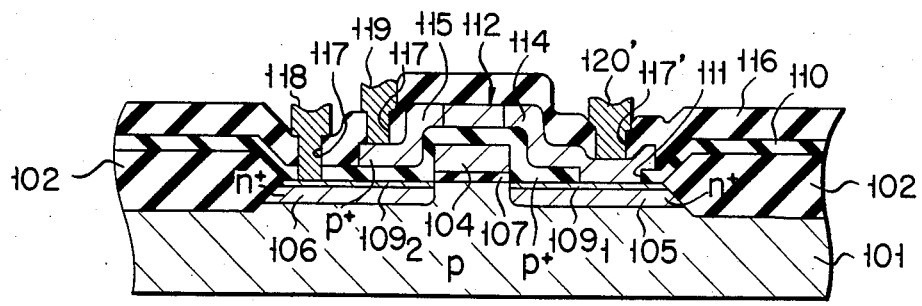
FIG. 7 shows a cross-sectional view of a stacked CMOS inverter according to another embodiment of the present invention.

Another embodiment of the semiconductor device of the present invention shown in FIG. 7 is different from that of FIG. 6 only in that the signal output electrode 120' is made to contact the p$^{30}$ type source region 114 of the polycrystalline silicon layer pattern 112 through the contact hole 117'. The operation and effects of the embodiment of FIG. 7 are the same as those of FIG. 6J.

What is claimed is:

1. A stacked CMOS (Complementary Metal Oxide Semiconductor) inverter comprising:
   a semiconductor substrate of a first conductivity type;
   an MOS transistor of a second conductivity type including a first source region and a first drain region, which are of said second conductivity type, provided in one of the surface regions of said semiconductor substrate to form a first channel region, a first insulation layer provided on said first channel region, and a gate electrode provided on said first insulation layer;
   a second insulation layer for covering the surfaces of said gate electrode, said first source region and said first drain region;
   an MOS transistor of said first conductivity type including a semiconductor layer formed on said second insulation layer which has a portion facing said gate electrode and serving as a second channel region, a portion facing said first source region and serving as a second source region of said first conductivity type, and a portion facing said first drain region and serving as a second drain region of said first conductivity type, and said gate electrode, with said second insulation layer, interposed between said gate electrode and said second channel region, being used as a gate insulation layer;
   first, second and third connection electrode means for connecting said first and second source regions, said first drain region, and second drain region, respectively, to an exterior circuit;
   means for electrically connecting together said first and second source regions while precluding formation of a parasitic diode between said first source region and said first connection electrode means comprising a first conductive layer of a metal silicide interposed directly between said first and second source regions, said first conductive layer covering the entire surface of said first source region, and said source region directly contacting said first conductive layer through a contact hole provided in said second insulating layer; and
   a second conductive layer, which is comprised of the same material as said first conductive layer, covering the entire surface of said first drain region.

2. A stacked CMOS inverter according to claim 1, wherein said first conductive layer is selected from PtSi (platinum silicide), MoSi (molybodenum silicide), WSi (tungsten silicide), and PdSi (palladium silicide).

3. A stacked CMOS inverter according to claim 1, wherein said first connection electrode means is directly connected to said first conductive layer.

4. A stacked CMOS inverter according to claim 1, wherein said first connection electrode means is directly connected to said second source region.

* * * * *